United States Patent

Hankee et al.

[11] 4,074,000
[45] Feb. 14, 1978

[54] PRESSURE SENSITIVE ADHESIVE DRAFTING FILMS FOR USE IN ELECTROSTATOGRAPHIC COPIERS

[75] Inventors: Roy H. Hankee, Penfield; Alp T. Akman, Rochester, both of N.Y.

[73] Assignee: Xerox Corporation, Stamford, Conn.

[21] Appl. No.: 736,034

[22] Filed: Oct. 27, 1976

[51] Int. Cl.$^2$ .................. B32B 5/16; B32B 19/02; B32B 27/08
[52] U.S. Cl. .................. 428/323; 428/325; 428/326; 428/328; 428/331; 428/332; 428/364; 428/447; 428/451; 428/452; 428/481; 428/507; 428/352; 428/914; 428/922
[58] Field of Search .............. 428/325, 327, 331, 328, 428/352, 354, 421, 447, 451, 507, 517, 518, 443, 914, 909, 913, 200, 212, 332, 323, 481, 452, 364, 922; 252/8.8 R; 156/230

[56] References Cited

U.S. PATENT DOCUMENTS

| | | | |
|---|---|---|---|
| 3,516,842 | 6/1970 | Klinker et al. | 428/914 X |
| 3,533,822 | 10/1970 | Bailey | 428/202 X |
| 3,567,571 | 3/1971 | Martinovich | 428/447 X |
| 3,607,526 | 9/1971 | Biegen | 156/230 X |
| 3,652,329 | 3/1972 | Vossos | 252/8.8 R X |
| 3,834,925 | 9/1974 | Matsumura et al | 428/914 X |
| 3,967,022 | 6/1976 | Hasei | 428/202 X |
| 3,975,325 | 8/1976 | Long | 252/8.8 R X |

FOREIGN PATENT DOCUMENTS

611,463  12/1960  Canada .................. 428/922

Primary Examiner—Thomas J. Herbert, Jr.
Assistant Examiner—R. Eugene Varndell, Jr.
Attorney, Agent, or Firm—James J. Ralabate; James Paul O'Sullivan; Jerome L. Jeffers

[57] ABSTRACT

Disclosed is a novel pressure sensitive adhesive drafting film which is specially formulated to permit it to be imaged in electrostatographic copiers. The film is a multilayered structure comprising layers from the top down of:

a. a matte coating capable of receiving and holding graphic information;

b. a layer of organic resinous material in film form;

c. a layer of pressure sensitive adhesive;

d. a release coating;

e. a layer of an organic resinous material in film form as release liner; and f. a back coating which is a layer of an organic resinous binder material having dispersed therein:

i. a particulate solid material of particle size ranging from 3 to 20 microns in the longest dimension, and ii. a water insoluble antistatic agent of a type to cause the film to have a surface resistivity in the range of from $10^9$ to $10^{14}$ ohms/sq.

14 Claims, 2 Drawing Figures

PRESSURE SENSITIVE ADHESIVE DRAFTING FILMS FOR USE IN ELECTROSTATOGRAPHIC COPIERS

BACKGROUND OF THE INVENTION

In the process of electrostatographic copying, a plate comprising a layer of photoconductive insulating material is electrostatically charged in the dark in order to apply a uniform charge to its surface. The charged plate is then exposed to activating radiation in imagewise configuration to selectively dissipate the charge in the illuminated areas while leaving behind a latent electrostatic image corresponding to the non-illuminated areas. The latent image is then developed by depositing finely divided electroscopic marking materials, commonly referred to as toner, on the surface of the plate. The toner particles are electrostatically attracted to the latent image and can be transferred to a receiving member such as paper in imagewise configuration. Thermal fusing of the toner into the receiving member provides a permanent copy. This concept, which was originally disclosed by Carlson in U.S. Pat. 2,297,691, has been further amplified in many related patents in the field.

In the self-adhesive drafting film market it is standard procedure to use sheets consisting of a film support coated on the back with a pressure sensitive adhesive and on the front with a matte coating. A second film having a release layer on its top surface is applied to the back of the first film. A release layer is applied to the second film so that upon its removal the adhesive layer is exposed. These films are used for making corrections in engineering drawings by marking the film's matte surface with the desired material, cutting out the marked portion of the drafting film, removing the release liner and sticking the so-prepared portion of the film on the drawing. In this manner, corrections can be made quickly without requiring erasure of the original drawing. In another use of these films, features which are used frequently in the drawing can be imprinted on the film and the drawing prepared using the feature from the self-adhesive drafting film. An example of this utility involves the preparation of circuit diagrams requiring repeated usage of the symbol for a diode. Rather than draw the symbol repeatedly; the draftsman can obtain a sheet of film already imprinted with a plurality of the symbols and easily apply them to the drawing in the appropriate places. This is accomplished by simply cutting out the symbol, removing the release liner to expose the adhesive and applying the symbol to the circuit diagram in the desired location. In some applications the entire sheet of film is used rather than just a cut out portion of it.

The matte coating of the drafting film can be imaged in any number of ways including offset printing. A convenient way to form this image is by means of an electrostatographic copier. However, imaging of conventional film to film pressure sensitive adhesive drafting films in electrostatographic copiers has proven problematical. This is the case because these films presently available to not possess the requisite surface conductivity to be easily processed in such copiers. In addition, the films are not readily manipulated by automatic sheet feeding devices in the copier because providing a stack of sheets with the back film of one sheet in contact with the matte coating of the sheet under it tends to cause the sheets to stick together and not feed one at a time, if at all.

It would be desirable, and it is an object of the present invention, to provide a novel film to film self adhesive drafting film which is suitable for imaging in electrostatographic copiers.

SUMMARY OF THE INVENTION

The present invention is a layered pressure sensitive self-adhesive film for use in preparing and correcting architectural, construction and engineering drawings. The film comprises layers from the top down of:

a. a matte coating capable of receiving and bearing graphic information;

b. a layer of an organic resinous material in film form as support for the matte coating;

c. a layer of pressure sensitive adhesive;

d. a release coating;

e. a layer of an organic resinous material in film form as release liner; and f. a back coating which is a layer of an organic resinous binder material having dispersed therein:

i. particulate silica of particle size ranging from 3 to 20 microns in the longest dimension, and ii. a water insoluble antistatic agent of a type and in an amount sufficient to cause the film to have a surface resistivity in the range of from $10^9$ to $10^{14}$ ohms/sq.

DETAILED DESCRIPTION AND PREFERRED EMBODIMENTS

Figure 1:
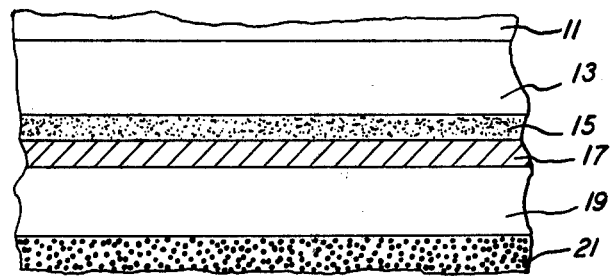

The improved drafting film of the present invention is schematically represented by FIG. 1. The top layer, i.e., matte coating, is designated 11. Sheet materials capable of receiving and holding graphic information generally comprise a film base whose exposed surface carries a synthetic resinous matte film forming composition. The need for a matte coating on the film base is due to the fact that indicia markings on uncoated plastic surfaces will readily rub, peel or flake off. Poor adhesion of the indicia marking on plastic surfaces is particularly troublesome in the drafting field where plastic films, plastic coated drafting cloths, etc., are commonly imaged with ink, pencil, crayon or the like. Plastic materials, therefore, require a pre-coating, generally from a lacquer, of a matte surface in order to accept the marking material directly. Dispersion of particulate material in the resin binder provides a surface having lands and valleys which enchances adhesion of the marking material to the sheet. Any film forming resinous material may be used as the support material for the matte coating. Thus, layer 13, in FIG. 1, which represents the resinous support film, may be made of polyethylene, polypropylene, poly(vinylchloride), poly(vinylacetate), etc. The most commonly used resinous support materials are polyesters. A specific polyester which finds widespread use is a heat-set and biaxially-oriented linear polyester such as terephthalic acid/ethylene glycol polyester sold under the tradename Mylar.

The matte lacquer coating is preferably a cellulosic film forming polymer dissolved in suitable solvents such as, methylethyl ketone, ethyl acetate, methyl isobutyl ketone, toluene, etc. Cellulosic materials are preferred when the support film is a polyester because the adhesion between the two materials is quite good. Included in the lacquer coating may be a plasticizer such as an alkyl resin or phthalate ester. In addition, a hardner such as urea-formaldehyde resin may also be added. This matte coating may vary in thickness from about 0.2 to 1.0 mil depending on the end use of the film. The matte layer may be applied by other techniques such as from a hot melt.

In order to provide a matte finish suitable for indicia marking, the coating will include a particulate substance such as an organic material which is incompatible with the film forming resin or an inorganic pigment such as a finely powdered glass having a particle size ranging from 2 to 6 microns in the particle's longest dimension or amorphous or diatomaceous silica of similar particle size. Titanium dioxide may also be added to impart a white background color and give the matte surface the necessary roughness for ink reception.

The next layer of the film, designated as 15, is the pressure sensitive adhesive. It is a general practice to coat the pressure sensitive adhesive over the release side of the release liner 19 first and then transfer it to the drafting film during lamination. Since the release coating 17 limits the wetting over its surface, the adhesive coating is applied from a solvent base or hot melt rather than as a water base coating. There are two types of adhesive; permanent and removable. In pressure sensitive adhesive drafting films, a removable type of pressure sensitive film, preferably of the repositionable type, is used. Acrylic type adhesives are desirable for use in films which are to be imaged in electrostatographic copiers because of their thermal stability. This is the case because the imaged film is heat treated in the copying process to fuse the toner particles into the sheet. Specific examples of acrylic adhesives which may be used are product No. 7598 marketed by Paisley Products of Edison, New Jersey, and product No. RA 1896 marketed by Monsanto Polymer and Petrochemicals Co. Traditionally, solvent based adhesives comprise a solution of rubber and resins or a solution of a polymerized acrylic. Solution acrylics, while being more expensive than the rubber based products, are generally chosen for their excellent elasticity, good ultraviolet and aging stability and good electrical properties.

The next layer 17 is required as a release coating for the pressure sensitive adhesive. This coating must be formulated to produce a fairly low release level so as to provide easy peel off. The release level should, however, be high enough so that the sandwich will not come apart in the copier during the imaging process. Silicone resins are preferred for use as the release coating although other materials such as fluorocarbons, e.g. Teflon, may be used. Various silicone resins marketed by the General Electric Company have been found to be suitable. These resins are typically employed in combination with a cure accelerator. Formulations using General Electric silicone resins and cure accelerators which have been found to be especially useful in the present invention are set out in Table I.

TABLE I

| Material | Formulation A | Formulation B |
|---|---|---|
| SS-4191 or SS-4164 | 100 parts | 100 parts |
| SS-4192C | 2.5 parts | 5 parts |
| SS-4259C | 1.5 parts | 5 parts |

General Electric SS-4259C is a low temperature fast cure accelerator for use with G.E. SS-4164 and SS-4191 release coatings for paper and plastic substrates. It has been found that SS-4259C, when used with SS-4191 and SS-4192C, forms an excellent release coating for non-paper substrates such as plastic films. Formula B in Table I will cure faster than Formula A but, depending on the adhesive used, may result in higher release. The release coating, which is typically applied by solvent coating or solventless extrusion, will normally be less than 0.2 mil in thickness.

The next layer of the drafting film of the present invention is the release liner designated as 19 in FIG. 1. This layer serves as a support for the silicone release coating and those other layers of the film which are stripped from the backing layer and applied to the document being created. The release liner is formulated of a resinous film forming material which may be either clear or opaque. An opaque backing layer is generally preferred because it provides an easy method of identifying the matte drafting layer side from the backing. The release liner is typically a Mylar type polyester or a Mylar film with polypropylene impurities or mineral fillers to cause an opaque appearance.

The final layer of the drafting film of this invention is the friction back coating designated as 21 on FIG. 1. The friction back coating, which will typically be from about 0.2 to 1 mil in thickness, is a very important part of the structure because it permits the film to feed, image and handle properly in electrostatographic copiers. The friction coating provides good performance if it has a certain friction level, smoothness and conductivity. Friction and smoothness levels are provided and controlled by the addition of certain particulate materials to the friction back coating. The friction coating is prepared by formulating a solution of a suitable film forming resin which is adhesive to the surface of the backing layer 19 and dispersing the particulate material therein. Those film forming resins previously mentioned as being useful in other layers of the film may also be used to form the backing layer and back coating. Typically, the size of the particulate material will range from about 3 to 20 microns in its longest dimension. By adding enough of the particulate material to the resin solution to provide from about 0.5 to 15 weight percent of the particulate material based on the dry resin, a film having a somewhat rough back surface is provided. An amount of particulate material greater than 15 weight percent of the resin can be used, but would normally not be for economic reasons. In this manner, individual sheets of drafting film stacked in a pile are encouraged to slide over one another and thereby feed properly in the automatic feed mechanisms with which most electrostatographic copiers are equipped. In the absence of the particulate material, one encounters the problem of trying to feed a single sheet of plastic which is in contact with another similar sheet which often results in misfeeds or multiple sheet feeds.

Figure 2:
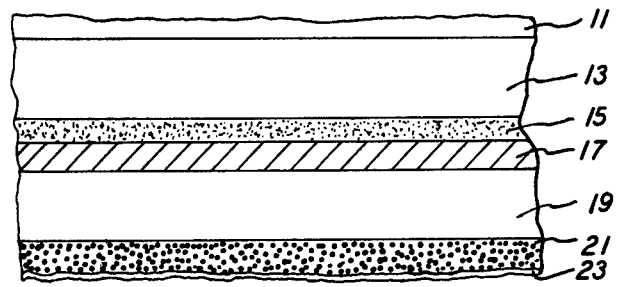

An antistatic agent is also added to the friction coating layer to dissipate the static charges from the film which are the result of ionization of air or contact with an electrically excited object. The antistatic agent should be sufficiently stable so as not to lose its effectiveness due to heat or aging and should not smear and transfer to other surfaces readily. The non-smearing requirement is important because any conductive agent transferred to the matte side of a sheet of drafting film will prevent toner transfer in the electrostatographic imaging process. In addition, any transfer to the photoreceptor of the copying machine will contaminate the device. Accordingly, water insoluble anti-static agents are used in the present invention. In another embodiment of the present invention the anti-static agent is coated over rather than mixed with the back coating. This embodiment is depicted in FIG. 2 in which layer 23 represents the layer of anti-static agent. In this embodiment the anti-static agent is applied in the form of a thin (0.01 to 0.06 mil) film.

The anti-static agent should be of a type and in an amount sufficient to cause the film to have a surface resistivity in the range of from $10^9$ to $10^{14}$ and preferably from $10^{10}$ to 12 ohms/sq. If the surface resistivity of the sheet is greater than $10^{14}$ ohms/sq., the "detack" corotron of the copying machine will not adequately dissipate the electrostatic field holding the sheet to the photoreceptor and the mechanism designed to remove it from the drum will fail at an unacceptably high rate. Conversely, if the resistivity of the sheet falls below $10^9$ ohms/sq., any charge on the sheet will bleed away. This is undesirable because during the transfer step of the xerographic cycle, a charge opposite in sign to that carried by the toner particles is applied to the transfer sheet. Dissipation of this charge results in poor copy quality since the transfer member will not electrostatically attract the toner on the drum. The resistivities referred to herein are measured at 72° F and 50% relative humidity on a Keithley 610B Electrometer equipped with a 6105 resistivity adaptor and a 240A Keithley power supply.

The anti-static agents useful in the present invention may be one or more conductive or semi-conductive materials. Suitable conductive materials are organic or inorganic salts. Exemplary of such salts are alkyl quaternary ammonium chlorides such as Arquad 18–50 (a 93% octadecyl, 6% hexadecyl, 1% octadecenyl quaternary ammonium chloride) or Arquad T (a 48% octadecenyl, 27% hexadecyl, 16% octadecyl, 6% octadienyl, 3% tetradecyl quaternary ammonium chloride) marketed by the Armour Industrial Chemical Company. In addition dialkyl quaternary ammonium chlorides such as Armour's Arquad 2HT-75 (a 75% octadecyl, 24% hexadecyl, 1% octadecenyl quaternary ammonium chloride and Armour's Armostat 310 (an N,N-bis-2-hydroxylethyl alkylamine) have been found to be suitable.

The present invention is further illustrated by the following example.

EXAMPLE

Eleven self-adhesive drafting films were prepared by the foregoing general method. Each film was back coated with a different material which was applied from methyl isobutyl ketone (MIBK) solvent. In each case the organic resin used in the back coating was made up of 3 parts by weight of a vinylchloride-vinyl acetate copolymer marketed under the tradename VMCH by Union Carbide and 7 parts by weight of an acrylic polymer (duPont's Lucite 44). This material, along with various additives, was coated onto the back of the drafting film to a thickness of about 0.3 mils and the solvent, which constituted approximately 50 parts by weight in each case, evaporated. The formulation for each back coating material is as follows:

1. polymer (3 parts VMCH and 7 parts Lucite 44) only
2. polymer + 4 parts particulate silica
3. polymer + 0.5 parts Armostat 310
4. polymer + 4 parts silica + 0.5 parts Armostat 310
5. polymer overcoated (0.03 mil) with Armostat 310 from its 3% isopropanol solution
6. polymer overcoated (0.03 mil) with a water soluble antistatic agent
7. polymer + 4 parts silica overcoated (0.03 mil) with Armostat 310
8. polymer + 4 parts silica overcoated (0.03 mil) with a water soluble anti-static agent
9. Arquad 310 coated onto polyester release liner - no backing polymer
10. Water soluble anti-static material coated directly on polyester
11. polyester back coating layer — no coating Resistivity measurements were made on the coated sheets using a Keithley 610B Electrometer at 73° F and 50% relative humidity. In addition, static and kinetic coefficient of friction measurements were made using ASTM standard method D/1894. The results of the resistivity and coefficient of friction tests are set out in Table II.

TABLE II

| | Sample | Surface Resistivity (ohm/sq.) a 50% Relative Humidity | Coefficient of Friction | |
|---|---|---|---|---|
| | | | Static | Kinetic |
| 1. | Polymer coated | $2.4 \times 10^{15}$ | 0.58 | 0.55 |
| 2. | Polymer + silica | $2.4 \times 10^{15}$ | 0.54 | 0.44 |
| 3. | Polymer + Arquad 310 | $8.7 \times 10^{12}$ | 0.54 | 0.46 |
| 4. | Polymer + silica + Arquad 310 | $1.2 \times 10^{14}$ | 0.58 | 0.44 |
| 5. | Polymer overcoated with Arquad 310 | $3.7 \times 10^{10}$ | 0.42 | 0.34 |
| 6. | Polymer overcoated with water soluble anti-static agent | $2.4 \times 10^{8}$ | 0.52 | 0.37 |
| 7. | Polymer + silica overcoated with Arquad 310 | $1.6 \times 10^{13}$ | 0.64 | 0.47 |
| 8. | Polymer + silica overcoated with water soluble anti-static agent | $9.6 \times 10^{12}$ | 0.63 | 0.57 |
| 9. | Polyester back layer overcoated with Arquad 310 | $2 \times 10^{11}$ | 0.33 | 0.29 |
| 10. | Polyester back layer overcoated with water soluble anti-static agent | $2.9 \times 10^{8}$ | 0.33 | 0.29 |
| 11. | Untreated back layer | $3.4 \times 10^{15}$ | 0.5 | 0.44 |

Those sheets exhibiting resistivity greater than $10^{14}$ ohms/sq. were found to be unsuitable for use in electrostatographic copiers because the conductivity was too low for the electrostatic attraction between the photoreceptor and sheet to be diminished by the detack corotron. The detack corotron is designed to reduce electrostatic attraction between the transfer sheet (drafting film in this case) and the surface of the photoreceptor after toner transfer. Failure of this step results in an inability to remove the transfer sheet from the photoreceptor.

Those sheets exhibiting resistivity less than $10^9$ ohms/sq. were unsuitable for use in electrostatographic copying due to poor copy quality.

It has also been determined that a static coefficient of friction of from 0.45 to 0.55 and a kenetic coefficient of friction from 0.55 to 0.65 is necessary for a sheet of drafting film to exhibit good feeding properties. The addition of silica or some other particulate material to the back coating is a convenient method to achieve the desired friction.

What is claimed is:

1. A layered, pressure sensitive, self-adhesive drafting film suitable for imaging in electrostatographic copiers which comprises from the top downward:
   a. a matte coating capable of receiving a holding graphic information;
   b. a layer of an organic resinous material as support for the matte coating;
   c. a pressure sensitive adhesive;
   d. a silicone release coating;
   e. a layer of an organic resinous material as release liner; and
   f. a back coating which is a layer of an organic binder material having dispersed therein:
      i. a particulate material of particle size ranging from 3 to 20 microns in the longest dimension; and
      ii. a water insoluble antistatic agent of a type and in an amount sufficient to cause the film to have a surface resistivity in the range of from $10^9$ to $10^{14}$ ohms/sq.

2. The film of claim 1 wherein the pressure sensitive adhesive is an acrylic type adhesive.

3. The film of claim 1 wherein the release liner is a silicone resin.

4. The film of claim 1 wherein the back coating contains from 0.5 to 15 weight percent of the particulate material.

5. The film of claim 1 wherein the surface resistivity is $10^{10}$ to $10^{12}$ ohms/sq.

6. The film of claim 1 wherein the support layer is a polyester.

7. The film of claim 6 wherein the polyester is a polyester formed by the polyesterification of terephthalic acid and ethylene glycol.

8. The film of claim 1 wherein the matte coating is a resinous organic material having particulate glass, amorphous or diatomaceous silica or titanium dispersed therein.

9. The film of claim 8 wherein the resinous portion of the matte coating is a cellulosic material.

10. The film of claim 1 wherein the release liner is opaque.

11. The film of claim 10 wherein the release liner is comprised of Mylar having polypropylene impurities or mineral fibers dispersed therein to provide an opaque appearance.

12. The film of claim 1 wherein the anti-static agent is an organic or inorganic salt.

13. The film of claim 12 wherein the anti-static agent is an alkyl quaternary ammonium chloride or a dialkyl quaternary ammonium chloride.

14. A multi-layered pressure sensitive drafting film suitable for imaging in electrostatographic copiers which comprises from the top down:
   a. a matte film capable of receiving and holding graphic information;
   b. a layer of organic resinous material;
   c. a layer of pressure sensitive adhesive;
   d. a release coating;
   e. a layer of an organic resinous material as release liner;
   f. a back coating comprising an organic binder material having dispersed therein a particulate material of particle size ranging from 3 to 20 microns in the longest dimension; and
   g. a thin (0.01 mil to 0.06 mil) layer of an anti-static agent of a type which causes the film to have a surface resistivity in the range of from $10^9$ to $10^{14}$ ohms/sq.

* * * * *